United States Patent
Fischer et al.

(10) Patent No.: US 10,423,631 B2
(45) Date of Patent: Sep. 24, 2019

(54) AUTOMATED DATA EXPLORATION AND VALIDATION

(71) Applicant: INTERNATIONAL BUSINESS MACHINES CORPORATION, Armonk, NY (US)

(72) Inventors: Ulrike Fischer, Dunboyne (IE); Francesco Fusco, Kilcock (IE); Pascal Pompey, Nanterre (FR); Mathieu Sinn, Dublin (IE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 268 days.

(21) Appl. No.: 15/405,607

(22) Filed: Jan. 13, 2017

(65) Prior Publication Data
US 2018/0203857 A1   Jul. 19, 2018

(51) Int. Cl.
*G06F 16/30* (2019.01)
*G06F 16/2457* (2019.01)
*G06F 17/50* (2006.01)
*G06F 16/248* (2019.01)

(52) U.S. Cl.
CPC ...... *G06F 16/24578* (2019.01); *G06F 16/248* (2019.01); *G06F 17/5009* (2013.01)

(58) Field of Classification Search
CPC ............. G06F 16/24578; G06F 16/248; G06F 17/5009
See application file for complete search history.

(56) References Cited

U.S. PATENT DOCUMENTS

| | | | |
|---|---|---|---|
| 8,763,074 B2 | 6/2014 | Bechtel et al. | |
| 9,280,324 B1 | 3/2016 | Lin et al. | |
| 2007/0038500 A1* | 2/2007 | Hammitt | G06N 5/02 705/7.11 |
| 2007/0244876 A1 | 10/2007 | Jin et al. | |
| 2008/0307523 A1* | 12/2008 | Subramanyam | G06F 17/30731 726/21 |
| 2013/0144888 A1* | 6/2013 | Faith | G06F 17/30696 707/748 |
| 2014/0280230 A1* | 9/2014 | Masato | G06F 17/30041 707/749 |
| 2015/0286709 A1* | 10/2015 | Sathish | G06N 7/005 706/52 |
| 2016/0034838 A1* | 2/2016 | Gembicki | G06Q 10/0639 705/7.39 |

* cited by examiner

*Primary Examiner* — Tarek Chbouki
(74) *Attorney, Agent, or Firm* — Griffiths & Seaton PLLC

(57) ABSTRACT

Embodiments for automated data exploration and validation by a processor. One or more optimal data flows are provided in response to a query for one or more heterogeneous data sources according to an inference model based on a knowledge graph of heterogeneous data source relationships, a plurality of data flows between one or more heterogeneous data sources relating to the query, and an ontology of concepts and representing a domain knowledge of the one or more heterogeneous data sources.

17 Claims, 10 Drawing Sheets

AUTOMATED DATA EXPLORATION AND VALIDATION

BACKGROUND OF THE INVENTION

Field of the Invention

The present invention relates in general to computing systems, and more particularly to, various embodiments for automated data exploration and validation using a computing processor.

Description of the Related Art

Computing systems may be found in the workplace, at home, or at school. Computer systems may include data storage systems, or disk storage systems, to process and store data. For example, the Internet provides for a system of interconnected computers and computer networks that use a standard Internet protocol suite (e.g., the Transmission Control Protocol (TCP) and Internet Protocol (IP)) to communicate with each other. The Internet of Things (IoT) is based on the idea that everyday objects, not just computers and computer networks, can be readable, recognizable, locatable, addressable, and controllable via an IoT communications network (e.g., an ad-hoc system or the Internet). In other words, the IoT can refer to uniquely identifiable devices and their virtual representations in an Internet-like structure.

SUMMARY OF THE INVENTION

Various embodiments for automated data exploration and validation by a processor, are provided. In one embodiment, by way of example only, a method for automated data exploration and validation, again by a processor, is provided. One or more optimal data flows are provided in response to a query for one or more heterogeneous data sources according to an inference model based on a knowledge graph of heterogeneous data source relationships, a plurality of data flows between one or more heterogeneous data sources relating to the query, and an ontology of concepts and representing a domain knowledge of the one or more heterogeneous data sources.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
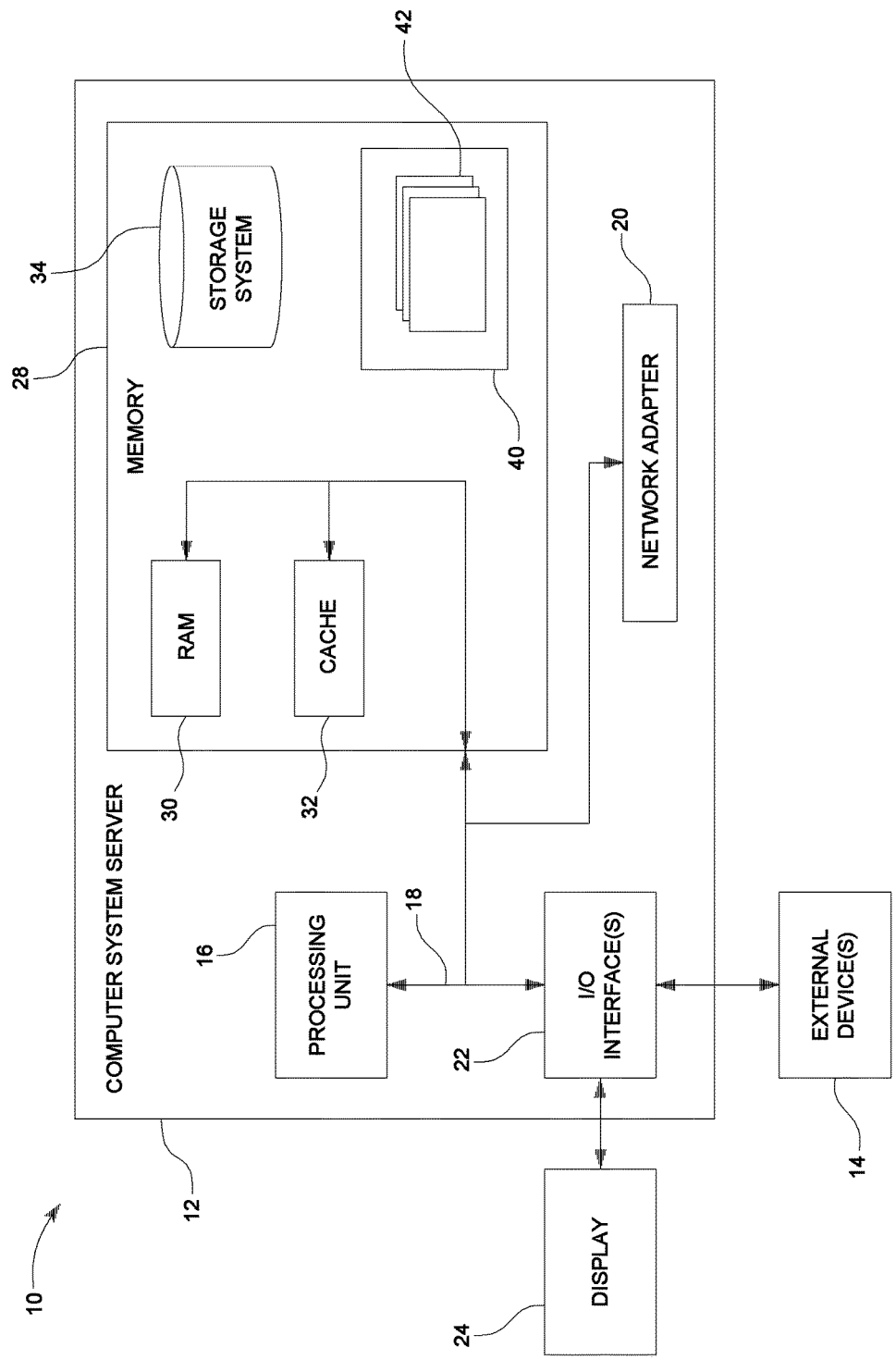
FIG. 1 is a block diagram depicting an exemplary cloud computing node according to an embodiment of the present invention.

As previously indicated, the Internet of Things (IoT) is an emerging concept of computing devices that may be embedded in objects, especially appliances, and connected through a network. An IoT network may include one or more IoT devices or "smart devices", which are physical objects such as appliances with computing devices embedded therein. Examples of network-enabled appliances may include thermostats, sensor based devices, smoke alarms, lights, home appliances, audio systems, televisions, security cameras, security sensors, and heating, ventilation, and air conditioning (HVAC) zones, among countless other examples. Many of these objects are devices that are independently operable, but they may also be paired with a control system or alternatively a distributed control system such as one running over a cloud computing environment. For example, these IoT networks and appliances may be used in energy grids, water networks, traffic networks, and or buildings.

Moreover, as the amount of electronic information continues to increase, the demand for sophisticated information access systems also grows. Digital or "online" data has become increasingly accessible through real-time, global computer networks. The data may reflect many aspects of the behavior of groups or individuals in a population, including scientific, educational, financial, travel, traffic flow, shopping and leisure activities, healthcare, and so forth. Many data-intensive applications require the extraction of information from data sources, such as, for example, within an energy utilities environment. The extraction of information may be obtained through a knowledge generation process that may include initial data collection among different sources, data normalization and aggregation, and final data extraction.

For example, retrieving, estimating, forecasting values for signals (e.g., the electrical load on one element within the electrical grid, the traffic flow on a road, the hydraulic pressure at a service point in a water supply network, etc.) is key for analysis and to enable control or improvement to industrial processes for domain experts, operational and data scientists working with these signals. Estimating the signals of interest can be extremely complicated and result in almost all of the data metered and measured today remaining idle (e.g., "cold data" that is infrequently accessed) in various databases without being used or monetized to improve or control industrial operations.

As such, various embodiments are provided herein for automated data exploration and validation. In one embodiment, one or more optimal data flows are provided in response to a query issue for or to one or more heterogeneous data sources per an inference model based on a knowledge graph of heterogeneous data source relationships, a plurality of data flows between one or more heterogeneous data sources relating to the query, and an ontology of concepts and representing a domain knowledge of the one or more heterogeneous data sources.

The present invention provides for automatically retrieving an optimal or "best" time-series data representation of signals of interest at a desired entity, by abstracting the underlying complexity involved in retrieving all relevant data sources (e.g., heterogeneous data sources), deriving functional relations, and appropriately combining signals at different entities, and/or evaluating each data flow based on a common inference model. The present invention may use and exploit associations between raw data sources and signals at entities, analytic components (e.g. statistical models) defined between signals, and/or hierarchical/topological relations (e.g. utility network connectivity) in knowledge graphs between entities, which may represent arbitrary functional relations.

In one aspect, a set of data flows may be provided with associated quality metrics (e.g., a confidence score). One or more users may provide feedback, via an interactive graphical user interface, with respect to the given quality metrics such that an inference model may be updated accordingly. Data source relationships may be defined between network entities and raw data or data models. Signal processing may be used for spatio-temporal alignment of different raw data sources. An analysis operation may be used to run specific analytic operations according to a query and to perform one or more data exploration tasks.

The present invention may define and identify entities (e.g., IoT devices or IoT networks) and relationships (e.g. hierarchical, physical connectivity) between the entities. The present invention may use raw data streams and links with signals and entities, model entity (e.g., heterogeneous data sources) relationships between signals. The entity relationships may each be explored, an inference model may be generated or built, and/or data flows may be ranked.

In one aspect, a thesaurus or ontology as the domain knowledge may be used for the automated data exploration and validation. The thesaurus and ontology may also be used to identify relationships between the heterogeneous data sources, related concepts representing a domain knowledge of the one or more heterogeneous data sources, and/or data flows.

In one aspect, the term "domain" is a term intended to have its ordinary meaning. In addition, the term "domain" can include an area of expertise for a system or a collection of material, information, content and/or other resources related to a particular subject or subjects. For example, a domain can refer to financial, energy, utility services, transportation, healthcare, advertising, commerce, scientific, industrial, educational, medical and/or biomedical-specific information. A domain can refer to information related to any particular subject matter or a combination of selected subjects.

The term ontology is also a term intended to have its ordinary meaning. In one aspect, the term ontology in its broadest sense may include anything that can modeled as ontology, including but not limited to, taxonomies, thesauri, vocabularies, and the like. For example, an ontology may include information or content relevant to a domain of interest or content of a particular class or concept. Content can be any searchable information, for example, information distributed over a computer-accessible network, such as the Internet. A concept can generally be classified into any of a number of concepts which may also include one or more sub-concepts. Examples of concepts may include, but are not limited to, scientific information, energy or water utilities, transportation, healthcare information, medical information, biomedical information, business information, educational information, commerce information, financial information, pricing information, information about individual people, cultures, groups, sociological groups, market interest groups, institutions, universities, governments, teams, or any other information group. The ontology can be continuously updated with the information synchronized with the sources, adding information from the sources to the ontology as models, attributes of models, or associations between models within the ontology.

The domain knowledge may be searched and queried to identify the relationship between heterogeneous data sources while mapping and matching heterogeneous data sources to the data flows. Using the domain knowledge, the most relevant heterogeneous data sources matching the data flows may be included in a hierarchy of heterogeneous data source relationships that may be created. In one aspect, the hierarchy of heterogeneous data source relationships (e.g. a graph) may include nodes of the graph representing the heterogeneous data source relationships from the domain knowledge. The hierarchy of heterogeneous data source relationships may be edited, validated, and/or corrected (moving nodes and leaves of the nodes). The hierarchy can also be used as guidance for clustering approach, enabling the user to select a level at which the actual terms grouping will be performed.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
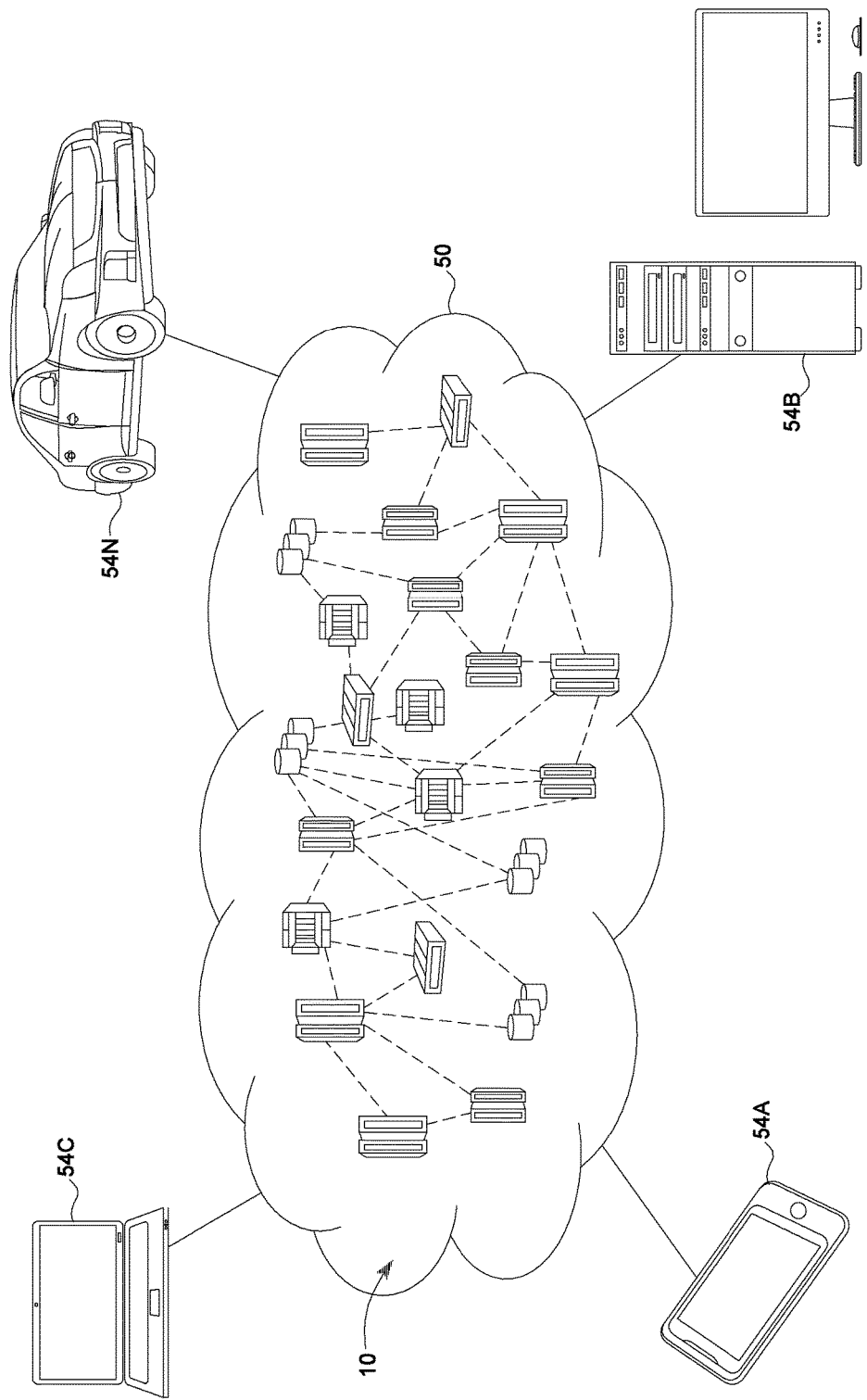
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
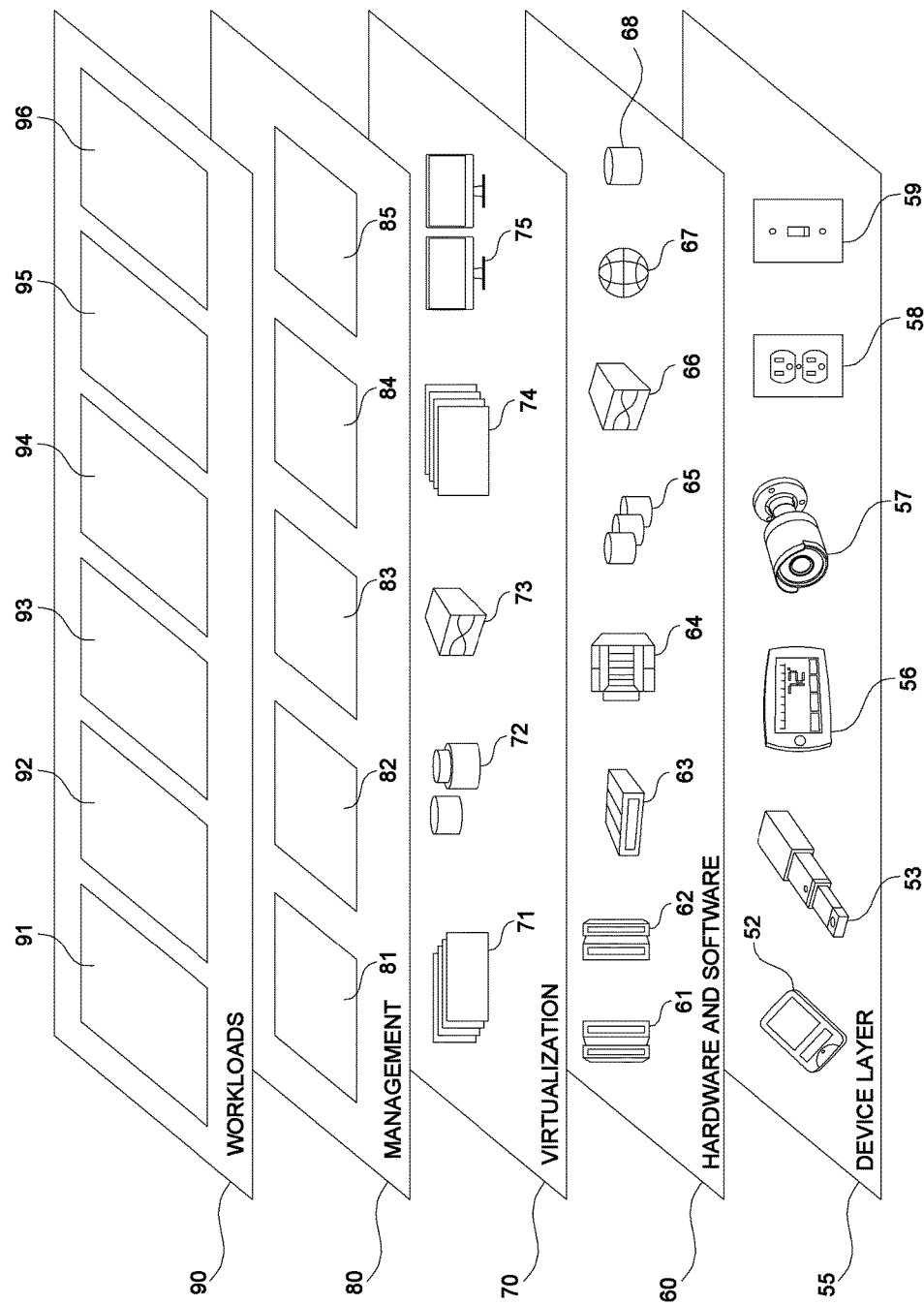
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various automated data exploration and validation workloads and functions 96. In addition, automated data exploration and validation workloads and functions 96 may include such operations automated data exploration and validation, and as will be further described, user and device management functions. One of ordinary skill in the art will appreciate that the automated data exploration and validation workloads and functions 96 may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

It should be noted that as described herein the mechanisms of the illustrated embodiments illustrate the domain knowledge of the "electrical utilities domain" for illustrative purposes only, but may also apply to any other domain knowledge. Thus, mechanisms of the illustrated embodiments may be implemented according to a domain knowledge of interest to a user.

Figure 4:
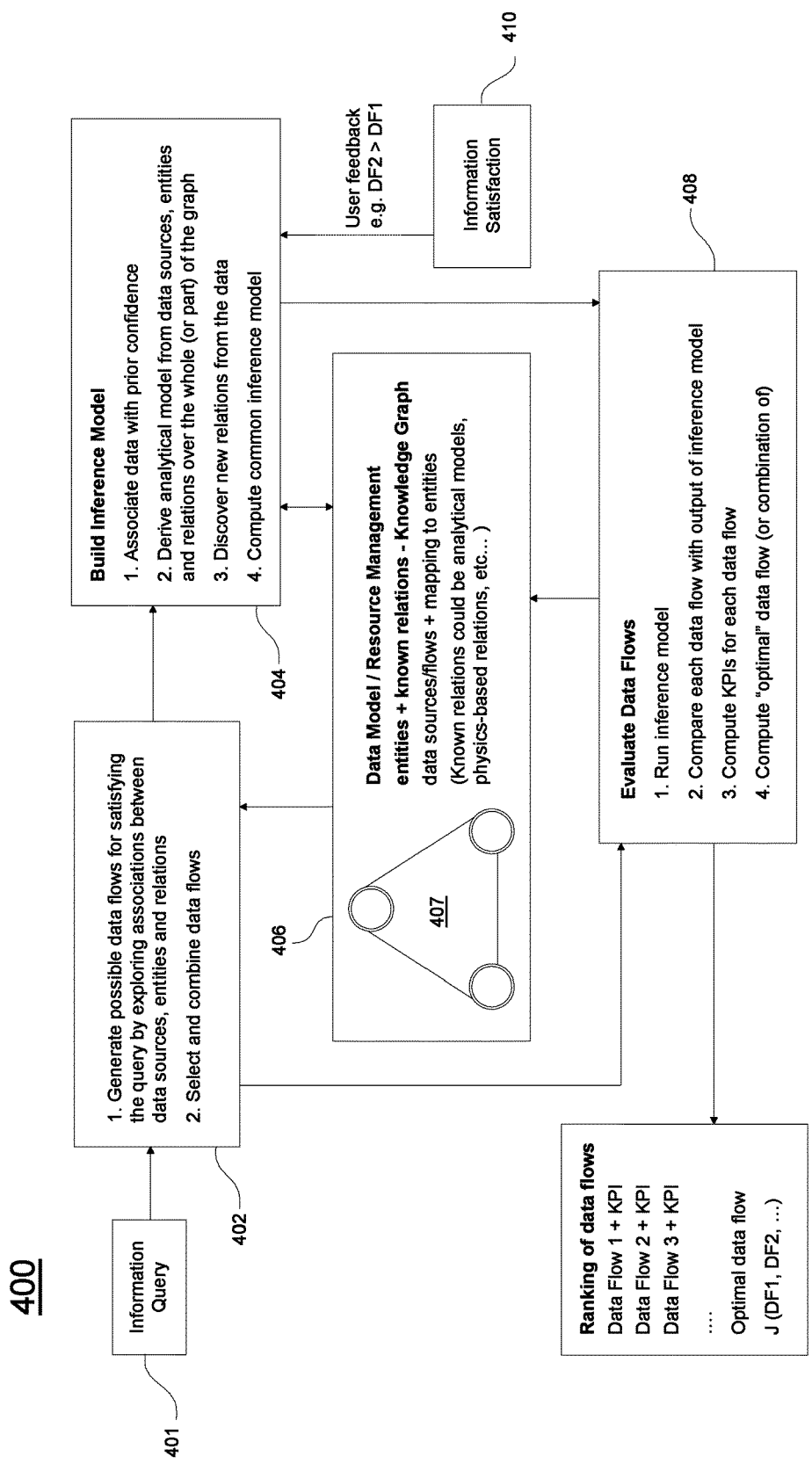
FIG. 4 is a diagram depicting an exemplary functional relationship between various aspects of the present invention.

Turning now to FIG. 4, a block diagram of exemplary functionality 400 relating to automated data exploration and validation is depicted, for use in the overall context of automated data exploration and validation according to various aspects of the present invention. As shown, the various blocks of functionality are depicted with arrows designating the blocks' 400 relationships with each other and to show process flow. Additionally, descriptive information is also seen relating each of the functional blocks 400. As will be seen, many of the functional blocks may also be considered "modules" of functionality, in the same descriptive sense as has been previously described in FIGS. 1-3. With the foregoing in mind, the module blocks 400 may also be incorporated into various hardware and software components of a system for image enhancement in accordance with the present invention, such as those described in FIGS. 1-3. Many of the functional blocks 400 may execute as background processes on various components, either in distributed computing components, or on the user device, or elsewhere.

In the depicted embodiment, a query (e.g., information query) may be sent and/or received (as shown in box 401). In response to the query, all possible data flows to entities of interest (e.g., physical IoT devices/networks or "data sources") may be generated that satisfy the query (shown in box 402). This may be performed by exploring and identifying one or more associations/relationships between each one of the data sources and/or entities of interest. One or more of the data flows may be selected and/or combined together.

As one of ordinary skill in the art will appreciate, the various data flows may be obtained from a wide variety of data sources, be it a local source or data sources/entities spread throughout the Internet as part of a distributed computing and/or cloud environment as may other portions of the blocks 400 of functionality. More specifically, one or more data models/resource management systems (as shown in box 406) may be employed which may contain a knowledge graph 407. The knowledge graph 407 may include information about each of the data sources/entities, relationships between each of the data sources/entities (e.g., physical characteristics of a power utility or substation in relation to other characteristics of other power utilities or substations or even other different entities), and may include a mapping to each of the entities. The mapping (of the knowledge graph 407) may illustrate and identify each of the data flows between one or more of the data sources/entities. The known relationships may be analytical models, physics-based relations, or other types of relationships common to a particular data source or entity.

As shown in box 404, an inference model may be built and/or generated. The inference model may combine all the data flows that have been generated with an analytical data model that may be common to each of the data flows, which may be derived from the data model/resource management (see block 406) that includes information relating to the entities, relationships, and the knowledge graph. Simply stated, the inference model may represent a theoretical construct of what a system should be doing as compared to what is taking place in the "real world." The inference model may also associate data with a confidence score. The analytical model relating to the data may be derived from the data sources, entities, and/or relationships between the data sources/entities over the knowledge graph, which may include or be built from a distributed system. Any new relationship relating to one or more data sources/entities may also be identified and/or discovered.

From box 402 and/or box 404, one or more of the data flows may be evaluated (as shown in box 408). To evaluate and analyze the data flows, the inference model may be used (e.g., run the inference model to analyze the data flows and analyze and inspect the data flows such as, for example, computing a metric for each of the data flows). The output data flows from the inference models may be compared to each other. One or more key performance indicators (KPIs) may be measured or calculated for each output data flow. An optimal or "best" data flow or a combination of optimal data flows may be determined or calculated. For example, the measured KPIs may be determined for each one of the data flows. A confidence score may be assigned to each data flow such as, for example, based on the measured KPIs. The confidence scores may be ranked such as, for example, ranking each of the data flows according to the confidence score. For example, the ranking of data flows may be for a plurality of data flows (e.g., Data Flows 1-3) such as, for example 1) Data Flow 1 plus (+) the KPIs ("DF1"), 2) Data Flow 2 plus (+) the KPIs ("DF2"), and 3) Data Flow 3 plus (+) the KPIs ("DF3"). One or more of the data flows, such as DF1-DF3, may be selected as the one or more optimal data flows having a highest confidence score as compared to those of the plurality of data flows having a lower confidence score in relation to each other according to the inference model. That is, an optimal data flow may be J(DF1, DF2, . . . ), where J is a variable or function. User feedback (e.g., "information satisfaction" information, corrections, edits, adjustments, and the like) may be identified, analysed, stored and/or provided to the inference model so as to more accurately identify associate data with an updated confidence score based on the feedback, identify relationships, update mapping of the relationships, discover new relationships, and/or match relationships and/or data sources/entities to include in the hierarchy of data sources and/or entities (as in block 410). For example, user feedback for DF2 may indicate that DF2 should be ranked greater than or more accurate than DF1.

Figure 5:
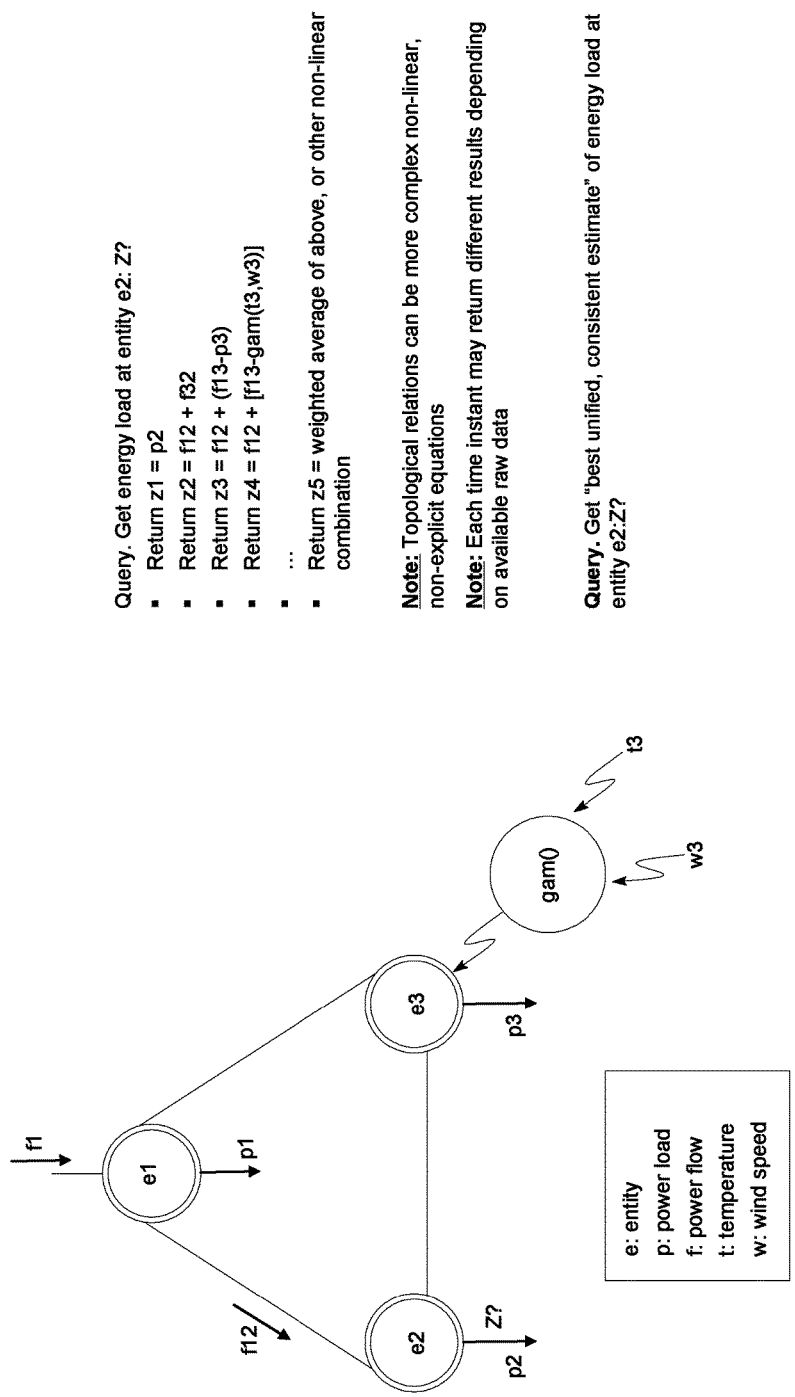
FIG. 5 is a diagram depicting an exemplary system for automated data exploration and validation for electrical utility data exploration in accordance with aspects of the present invention.
Figure 6:
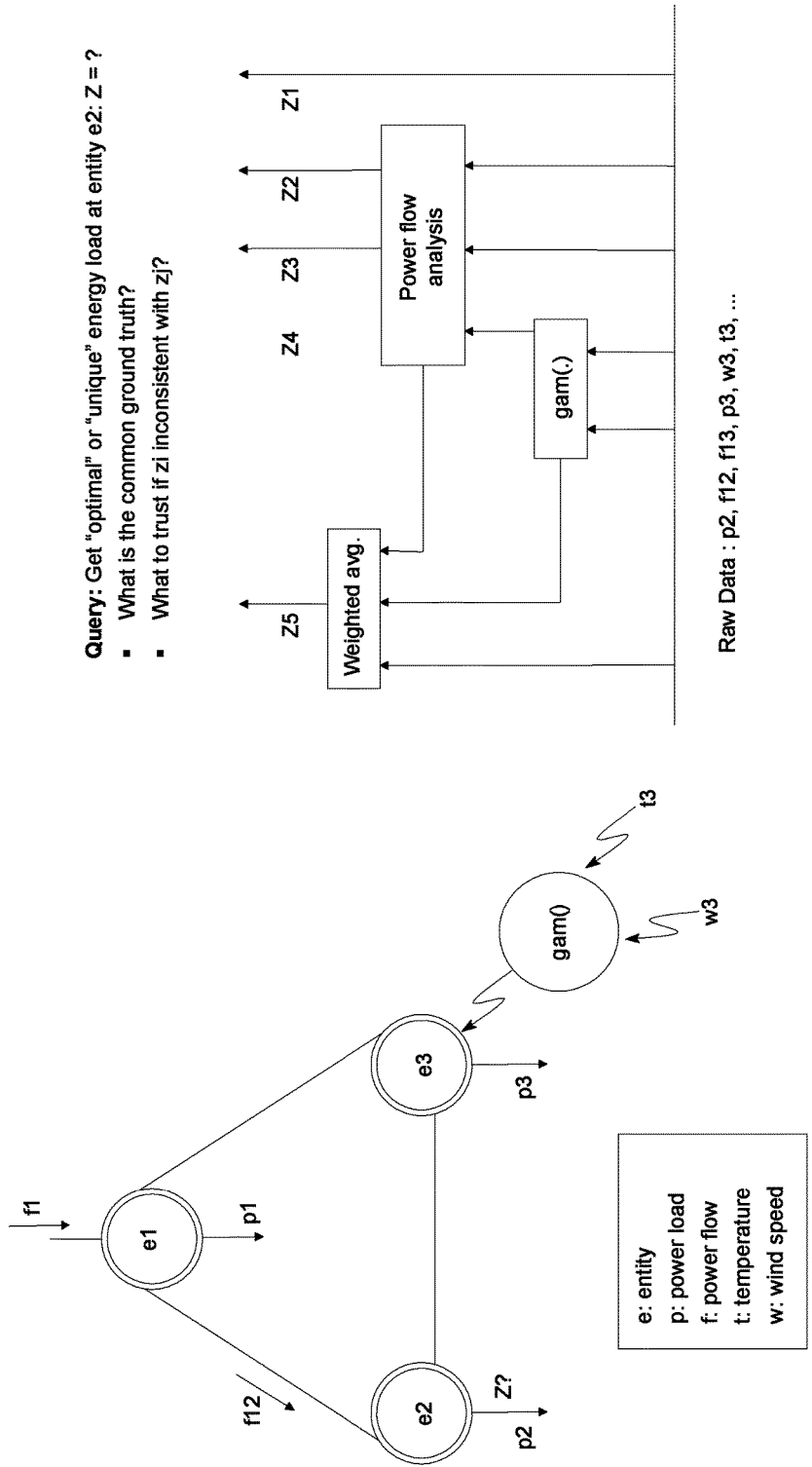
FIG. 6 is a diagram depicting an exemplary system for automated data exploration and validation for electrical utility data exploration based on data flows and analytic flows in accordance with aspects of the present invention.
Figure 7:
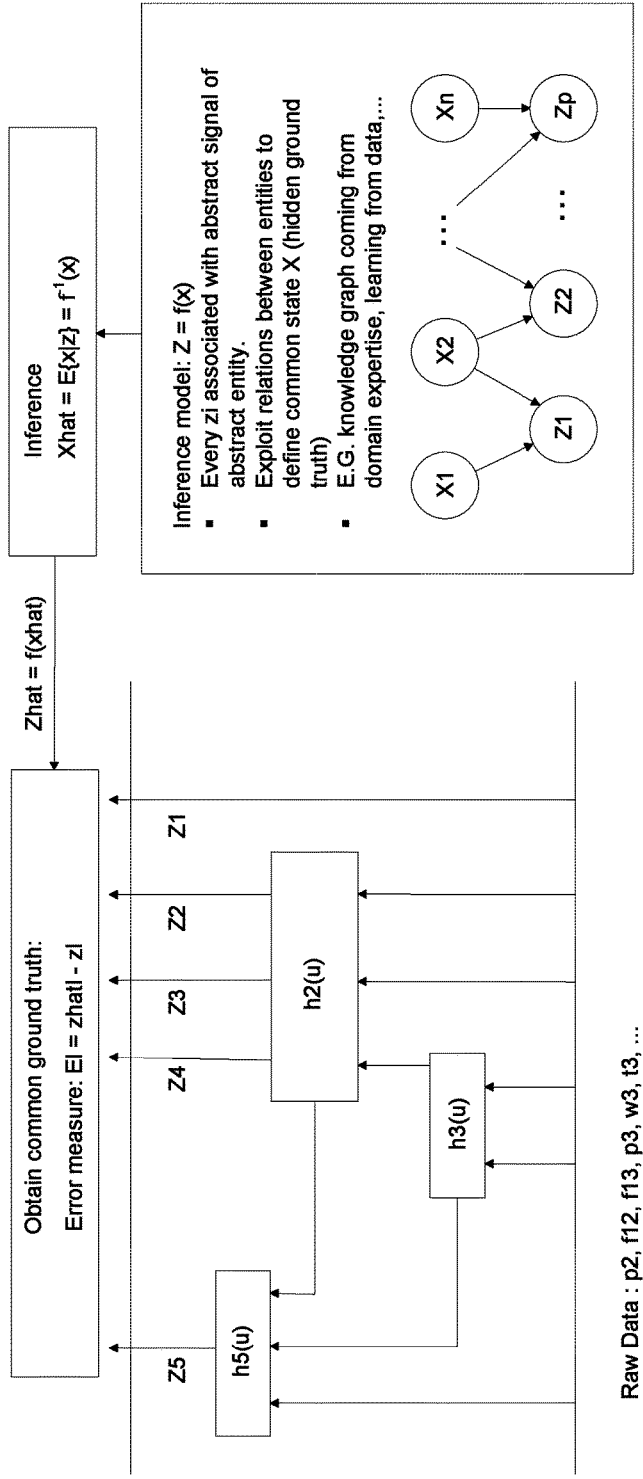
FIG. 7 is a diagram depicting an exemplary system for automated data exploration and validation for electrical utility data exploration using an inference model in accordance with aspects of the present invention.

Consider the following example of various implementations of the aforementioned functionality as illustrated in FIGS. 5-7. With the foregoing in mind and as a preliminary matter, the systems 500, 600, and 700 of FIGS. 5-7 respectively, may also be incorporated into various hardware and software components of a system for image enhancement in accordance with the present invention, such as those described in FIGS. 1-4. The systems 500, 600, and 700 may execute as background processes on various components, either in distributed computing components, or on the user device, or elsewhere.

FIG. 5 is a diagram depicting an exemplary operation 500 for automated data exploration and validation for electrical utility data exploration using a knowledge graph in accordance with aspects of the present invention. In one aspect, a query may be received for data exploration of one or more data sources or entities of interest such as, for example, electrical utilities, comprising entity e1 (such as a substation), entity e2, and entity e3. The query may be for retrieving or determining the energy load ("Z") at entity e2. The query may return as energy load Z1 for power load (P2) for entity e2 (e.g., z1=p2). The query may return as energy load Z2 a power flow (f12) added to the power flow (f32) (e.g., z2=f12+f32). The query may return as energy load Z3 a power flow (f12) added to the power flow (f13) minus the power load (P3) (e.g., Z3=f12+(f13−p3). The query may return as energy load Z4 a power flow (f12) added to [power flow (f13) minus gam(t3, w3)], where gam is a data model, "t" is temperature, and "w" is wind speed (e.g., Z4=f12+[f13−gam(t3,w3)]). It should be noted that topological relations may be more complex, non-linear, and non-explicit equations. Also, each data flow response may provide different results depending on available data.

Turning now to FIG. 6, a diagram depicting an additional exemplary system 600 for automated data exploration and validation for electrical utility data exploration based on data flows and analytic flows in accordance with aspects of the present invention. Similar to FIG. 5, the query is received from determining what the optimal or "unique" energy load is at entity e2. The query may request determining what is the common ground truth and how much trust should be placed in the response if a first data flow response ("zi") is inconsistent with the second data flow response ("zj"). As illustrated, data flows and analytic flows illustrate the use of a power flow analysis, a data model (gam) and a weighted average of the outputs of the power flow analysis and data model. The power flow analysis may be performed on energy load Z2, energy load Z3, and/or energy load Z4. The power flow analysis results may be provided and combined with energy load Z4 results that have been applied to the gam data model along with other raw data of p2, f12, f13, p3, w3, and/or t3. The weighted average may be determined, calculated, and/or measured and then be outputted as the energy load Z5.

However, in a more advanced approach, the present invention may utilize the inference model as illustrated in FIG. 7. FIG. 7 is a diagram depicting an exemplary system for automated data exploration and validation for electrical utility data exploration using an inference model in accordance with aspects of the present invention. Similar to FIGS. 5-6, the query is received for determining what the optimal, consistent or "unique" energy load ("Z") is at entity e2 (e.g., what is "Z=to" for entity e2?"). To obtain the common ground truth (e.g., information provided by direct observation as opposed to information obtained by inference) or "error measure" in the data flow response to the query, the error measure "EI" may be equal zhatI subtracted from ZI (e.g., EI=zhatI−zI), where I may be a variable and zhat may be equal to the inference model metric or function f(xhat) (e.g., "Zhat=f(xhat)"). Xhat may be equal to the energy (E){x|z} that is equal to f$^{-1}$(x) (e.g., "Xhat=E{x|z}=f$^{-1}$(x)"). In one aspect, the inference model is Z is equal to the function f(x) (e.g., "Z=f(x)"). Every "zi" may be associated with a signal from an entity. Each of the relationships of the entities may be identified and exploited to define a common state "X" (e.g., hidden ground truth). The knowledge graph may be generated from a knowledge domain (domain expertise) and information learned from the data flows such as, for example, X1 and X2 relate to Z1. X2 may relate to Z2, and/or Xn may relate to Zp.

As illustrated, energy load Z2, energy load Z3, and/or energy load Z4 (received from the signal output of h3(u)) are received in h2(u) with the results flowing in h5(u). The output of h3(u) may also flow into as input to h5(u). Z1 may be identified as non-essential and ranked lower.

Figure 8:
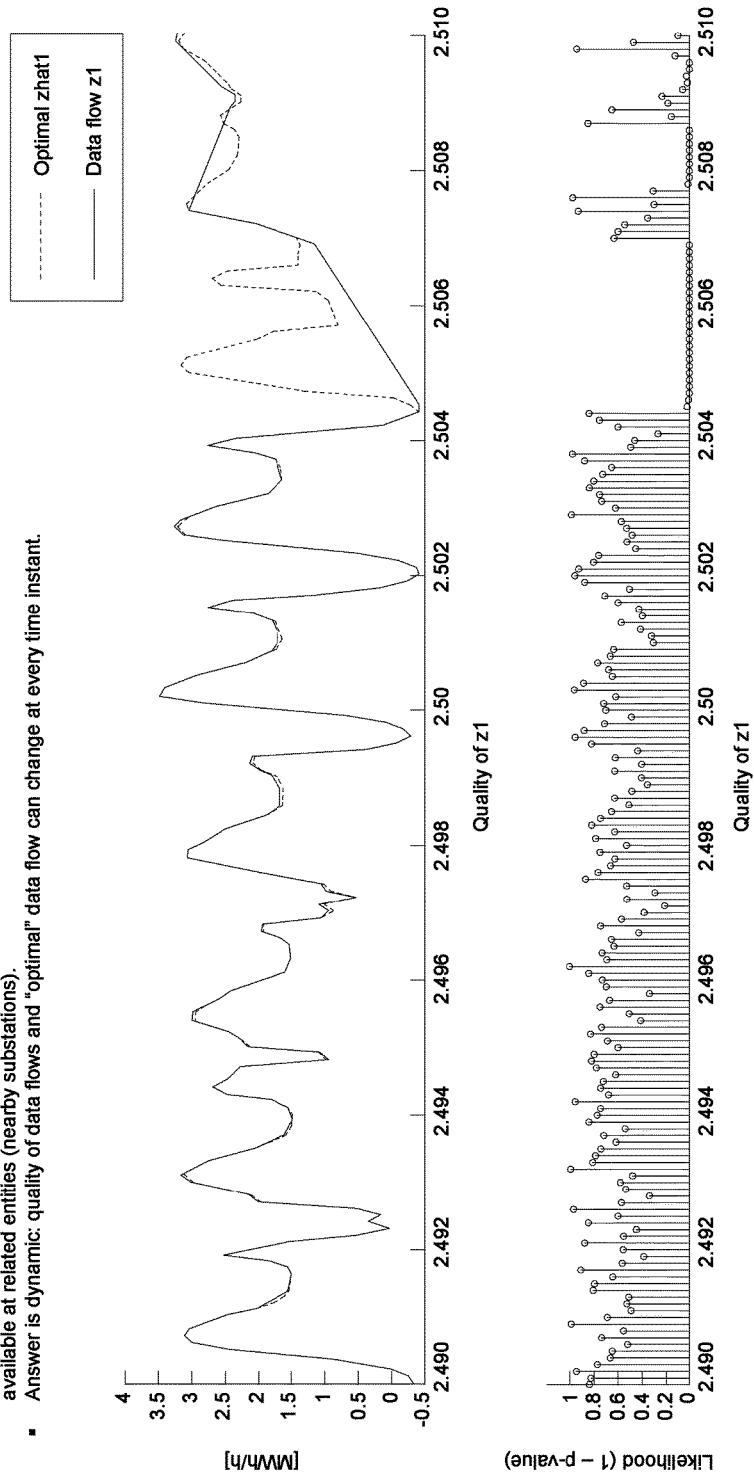
FIG. 8 is a graph diagram depicting electrical utility data exploration results of FIG. 7 by a processor, in which aspects of the present invention may be realized.

Turning now to FIG. 8, is a graph diagram depicting electrical utility data exploration results of FIG. 7. The user query may be used to determine the optimal data for an electrical substation 1. The quality measure and "optimal" answer/data flow response (e.g., optimal zhat1) may be determined by exploiting relations between data flow z1 and data flows available at related entities (nearby substations). In one aspect, the "optimal" answer/data flow may be dynamic in that the quality of data flows and "optimal" data flow can change at each selected time period. For example, for electrical utility data explorations, a user query may be a request, for example, to obtain (or get) optimal or best data for an electrical substation such as, for example, substation 1. The quality measure and the optimal or best response to the query may be determined by exploiting relations between data flow z1 and data flows available at related entities (e.g., nearby substations that may be located within a defined or selected distance). Also, the response or "answer" to the query may be dynamic such that the quality of data flows and the "optimal" or best data flow may change or adjust at each instance of time (e.g., dynamically changing in real time).

Figure 9:
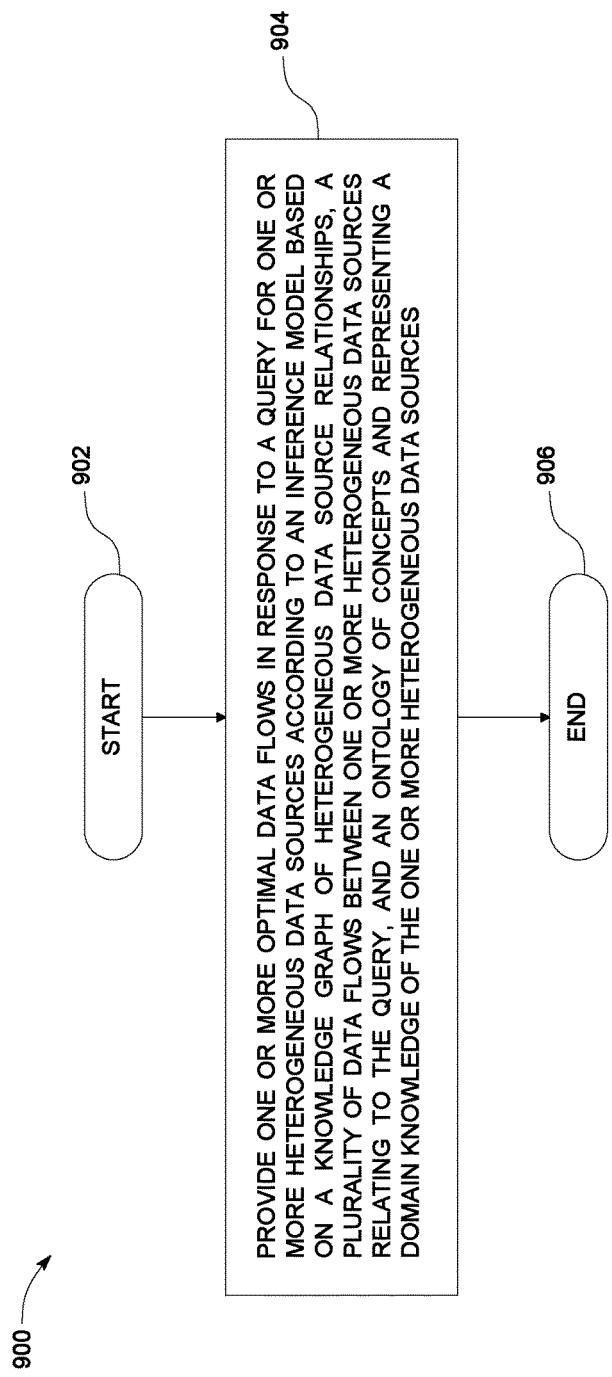
FIG. 9 is a flowchart diagram depicting an exemplary method for automated data exploration and validation by a processor; again in which aspects of the present invention may be realized.

Turning now to FIG. 9, a method 900 for automated data exploration and validation by a processor is depicted, in which various aspects of the illustrated embodiments may be implemented. That is, FIG. 9 is a flowchart of an additional example method 900 for automated data exploration and validation in a computing environment according to an example of the present invention. The functionality 900 may be implemented as a method executed as instructions on a machine, where the instructions are included on at least one computer readable medium or one non-transitory machine-readable storage medium. The functionality 900 may start, as in block 902. One or more optimal data flows may be provided in response to a query for one or more heterogeneous data sources according to an inference model based on a knowledge graph of heterogeneous data source relationships, a plurality of data flows between one or more heterogeneous data sources relating to the query, and an ontology of concepts and representing a domain knowledge of the one or more heterogeneous data sources, as in block 904. The functionality 900 may end in block 906.

Figure 10:
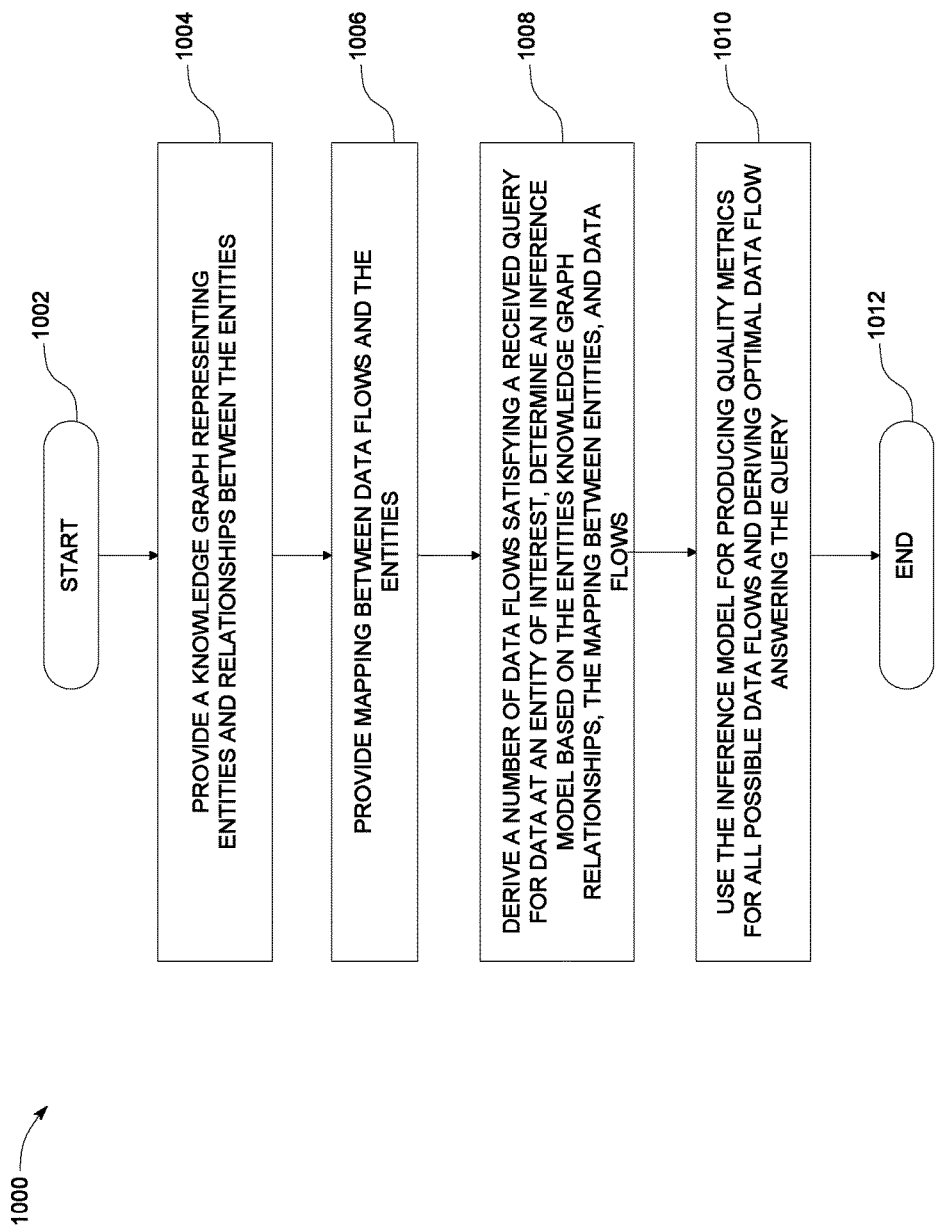
FIG. 10 is a flowchart diagram depicting an exemplary method for automated data exploration and validation by a processor; again in which aspects of the present invention may be realized.

Turning now to FIG. 10, an additional method 1000 for automated data exploration and validation by a processor is depicted, in which various aspects of the illustrated embodiments may be implemented. The functionality 1000 may be implemented as a method executed as instructions on a machine, where the instructions are included on at least one computer readable medium or one non-transitory machine-readable storage medium. The functionality 1000 may start, as in block 1002. A knowledge graph representing entities and relationships between the entities may be provided, as in block 1004. A mapping may be provided between data flows and the entities, as in block 1006. A number of data flows may be derived (or generated) satisfying a received query for data at an entity of interest (or data source), as in block

1008. Also, block 1008 may also include generating and/or determining inference model based on the entities knowledge graph relationships, the mapping between entities, and data flows. The inference model may be used for producing quality metrics for all possible data flows and deriving optimal data flow answering the query, as in block 1010. The functionality 1000 may end in block 1012.

In one aspect, in conjunction with and/or as part of at least one block of FIGS. 9 and 10, the operations of methods 900 and 1000 may include each of the following. The operations of methods 900 and 1000 may include measuring one or more key performance indicators (KPIs) of each of the plurality of data flows that answer the query; and assigning a confidence score to each of the plurality of data flows for each of the plurality of data flows based on the KPIs. Each of the plurality of data flows may be ranked according to the confidence score. User feedback may be received relating to the confidence score such that the inference model is updated based on the user feedback.

The methods 900 and 1000 may include selecting, as the one or more optimal data flows, at least one of the plurality of data flows having a highest confidence score as compared to those of the plurality of data flows having a lower confidence score in relation to each other according to the inference model. A mapping may also be provided between plurality of data flows and the one or more heterogeneous data sources on the knowledge graph that satisfy the query.

The methods 900 and 1000 may also include providing an analytical flow for one or more of the plurality of data flows for those of the one or more heterogeneous data sources that are undetected; aggregating or disaggregating one or more of the one or more of the plurality of data flows for the one or more heterogeneous data sources that are nested within the knowledge graph; and/or receiving one or more criteria from a user via an interactive graphical user interface (GUI) to use for defining the one or more optimal data flows.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The invention claimed is:

1. A method, by a processor, for automated data exploration and validation, comprising:
   providing one or more optimal data flows in response to a query for one or more heterogeneous data sources according to an inference model based on a knowledge graph of heterogeneous data source relationships, a plurality of data flows between one or more heterogeneous data sources relating to the query, and an ontology of concepts and representing a domain knowledge of the one or more heterogeneous data sources;
   providing an analytical flow for one or more of the plurality of data flows for those of the one or more heterogeneous data sources that are undetected;
   aggregating or dis aggregating two or more of the one or more of the plurality of data flows for the one or more heterogeneous data sources that are nested within the knowledge graph; and
   receiving one or more criteria from a user via an interactive graphical user interface (GUI) to use for defining the one or more optimal data flows.

2. The method of claim 1, further including:
   measuring one or more key performance indicators (KPIs) of each of the plurality of data flows that answer the query; and
   assigning a confidence score to each of the plurality of data flows for each of the plurality of data flows based on the KPIs.

3. The method of claim 2, further including ranking each of the plurality of data flows according to the confidence score.

4. The method of claim 1, further including receiving user feedback relating to a confidence score such that the inference model is updated based on the user feedback.

5. The method of claim 1, further including selecting, as the one or more optimal data flows, at least one of the plurality of data flows having a highest confidence score as compared to those of the plurality of data flows having a lower confidence score in relation to each other according to the inference model.

6. The method of claim 1, further including providing a mapping between plurality of data flows and the one or more heterogeneous data sources on the knowledge graph that satisfy the query.

7. A system for automated data exploration and validation, comprising: one or more computers with executable instructions that when executed cause the system to: provide one or more optimal data flows in response to a query for one or more heterogeneous data sources according to an inference model based on a knowledge graph of heterogeneous data source relationships, a plurality of data flows between one or more heterogeneous data sources relating to the query, and an ontology of concepts and representing a domain knowledge of the one or more heterogeneous data sources, provide an analytical flow for one or more of the plurality of data flows for those of the one or more heterogeneous data sources that are undetected; aggregate or disaggregate two or more of the one or more of the plurality of data flows for the one or more heterogeneous data sources that are nested within the knowledge graph; and receive one or more criteria from a user via an interactive graphical user interface (GUI) to use for defining the one or more optimal data flows.

8. The system of claim 7, wherein the executable instructions:
   measure one or more key performance indicators (KPIs) of each of the plurality of data flows that answer the query; and
   assign a confidence score to each of the plurality of data flows for each of the plurality of data flows based on the KPIs.

9. The system of claim 7, wherein the executable instructions rank each of the plurality of data flows according to the confidence score.

10. The system of claim 7, wherein the executable instructions receive user feedback relating to a confidence score such that the inference model is updated based on the user feedback.

11. The system of claim 7, wherein the executable instructions select, as the one or more optimal data flows, at least one of the plurality of data flows having a highest confidence score as compared to those of the plurality of data flows having a lower confidence score in relation to each other according to the inference model.

12. The system of claim 7, wherein the executable instructions provide a mapping between plurality of data flows and the one or more heterogeneous data sources on the knowledge graph that satisfy the query.

13. A computer program product for, by a processor, automated data exploration and validation, the computer program product comprising a non-transitory computer-readable storage medium having computer-readable program code portions stored therein, the computer-readable program code portions comprising: an executable portion that provides one or more optimal data flow s in response to a query for one or more heterogeneous data sources according to an inference model based on a knowledge graph of heterogeneous data source relationships, a plurality of data flows between one or more heterogeneous data sources relating to the query, and an ontology of concepts and representing a domain knowledge of the one or more heterogeneous data sources;
   an executable portion that provides an analytical flow for one or more of the plurality of data flows for those of the one or more heterogeneous data sources that are undetected, an executable portion that aggregates or disaggregates two or more of the one or more of the plurality of data flows for the one or more heterogeneous data sources that are nested within the knowledge graph; and an executable portion that receives one or more criteria from a user via an interactive graphical user interface (GUI) to use for defining the one or more optimal data flows.

14. The computer program product of claim 13, further including an executable portion that:
measures one or more key performance indicators (KPIs) of each of the plurality of data flows that answer the query;
assigns a confidence score to each of the plurality of data flows for each of the plurality of data flows based on the KPIs; and
ranks each of the plurality of data flows according to the confidence score.

15. The computer program product of claim 13, further including an executable portion that receives user feedback relating to a confidence score such that the inference model is updated based on the user feedback.

16. The computer program product of claim 13, further including an executable portion that selects, as the one or more optimal data flows, at least one of the plurality of data flows having a highest confidence score as compared to those of the plurality of data flows having a lower confidence score in relation to each other according to the inference model.

17. The computer program product of claim 13, further including an executable portion that provides a mapping between plurality of data flows and the one or more heterogeneous data sources on the knowledge graph that satisfy the query.

* * * * *